United States Patent
Patti

(10) Patent No.: US 6,441,446 B1
(45) Date of Patent: Aug. 27, 2002

(54) DEVICE WITH INTEGRATED BIPOLAR AND MOSFET TRANSISTORS IN AN EMITTER SWITCHING CONFIGURATION

(75) Inventor: Davide Patti, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/505,461

(22) Filed: Feb. 18, 2000

(30) Foreign Application Priority Data

Feb. 18, 1999 (IT) .......................................... MI99A0331

(51) Int. Cl.⁷ ............................................. H01L 29/76
(52) U.S. Cl. ..................... 257/378; 257/578; 257/587; 438/206; 438/356
(58) Field of Search ........................ 257/592, 578–582, 257/499–502, 500, 557, 378, 587; 438/370, 206, 208, 356, 329

(56) References Cited

U.S. PATENT DOCUMENTS

| | | | | |
|---|---|---|---|---|
| 5,525,826 A | * | 6/1996 | Palara | 257/378 |
| 5,602,416 A | * | 2/1997 | Zambrano | 257/500 |
| 5,998,855 A | * | 12/1999 | Patti | 257/578 |
| 6,069,399 A | * | 5/2000 | Patti | 257/592 |

* cited by examiner

Primary Examiner—Matthew Smith
Assistant Examiner—Calvin Lee
(74) Attorney, Agent, or Firm—Lisa K. Jorgenson; Robert Iannucci; SEED IP Law Group PLLC

(57) ABSTRACT

The device is constituted by an N+ substrate, by an N− layer on the substrate, by a metal contact for a collector, by a buried P− base region, by a P+ base contact and insulation region within which an insulated N region is defined, by a metal contact on the base contact region for a base, by an N+ emitter region buried in the insulated region and forming a pn junction with the buried base region, by a P+ body region in the insulated region, by an N+ source region in the P+ region, by a metal contact for a source, and by a gate electrode. In order to achieve a low resistance Ron, the P+ body region extends as far as the buried N+ emitter region and an additional N+ region is provided within the body region and constitutes a drain region, defining, with the source region, the channel of a lateral MOSFET transistor.

20 Claims, 2 Drawing Sheets

DEVICE WITH INTEGRATED BIPOLAR AND MOSFET TRANSISTORS IN AN EMITTER SWITCHING CONFIGURATION

TECHNICAL FIELD

The present invention relates to monolithic integrated semiconductor structures and, more particularly, to a device with a bipolar transistor and a MOSFET transistor connected to one another in the "emitter switching" configuration.

BACKGROUND OF THE INVENTION

As is known, an "emitter switching" configuration is constituted by a vertical bipolar transistor, usually a high-voltage power transistor, and by an electronic switch in series with the emitter of the bipolar transistor. The electronic switch is advantageously a low-voltage power MOSFET transistor connected by its drain terminal to the emitter terminal of the bipolar transistor. By opening the electronic switch, it is possible to switch off the bipolar transistor extremely rapidly and this configuration is therefore used advantageously in applications in which the bipolar transistor is operated with rapid switching between its conductive and non-conductive states.

An integrated structure of a known device comprising a bipolar power transistor and a MOSFET transistor in the above-mentioned configuration, as shown in FIG. 1 of the drawings appended to the present description, is formed on a substrate 10 of semiconductor material, for example, a monocrystalline silicon chip of the N+ type, that is, having a high concentration of N-type impurities. (It should be noted that, in the drawing, the concentrations of the N-type and P-type impurities are indicated, in conventional manner, by the addition of the − or + sign to the letters N and P; the letters N and P without the addition of a − or + sign denote concentrations of intermediate value).

Two epitaxial layers 11 and 12 of the N− and N types, respectively, are formed on the substrate 10. The layer 11, together with the substrate 10, contains the collector region of the bipolar transistor. A metal layer 28 applied to the free surface of the substrate constitutes the collector electrode C.

A buried P− region, indicated 13, formed between the epitaxial layers 11 and 12, constitutes the base region of the bipolar transistor. A P+ insulation and deep base contact region 15 extends from the front surface of the chip, that is, from the surface remote from the collector electrode C, as far as the edge of the base region 13, and an N insulation region, indicated 16, is defined within the region 15. A second, buried N-type region 14 with a high concentration of impurities, formed on the P− region 13 so as to form a pn junction therewith, constitutes the emitter region of the bipolar transistor.

A P region 25 which extends within the insulated region 16 constitutes the body region of the MOSFET transistor and contains the channel of that transistor. A region 26 formed within the body region 25 constitutes the source region of the MOSFET transistor. A strip 22 of electrically conductive material, disposed above the channel and insulated from the surface of the chip, constitutes the gate electrode of the MOSFET transistor, which is also an electrode of the device, indicated G.

Two electrically conductive surface contact strips 4 and 5 are formed on the source region 26 and on the insulation region 15, respectively, in order to form the source electrode S of the MOSFET transistor and the base electrode B of the bipolar transistor, respectively. The drain region of the MOSFET transistor is constituted by the portion of the insulation N region 16 disposed between the buried emitter region 14 and the body region 25 and is not connected to external electrodes.

The structure described above usually constitutes an elemental functional component of a power device formed by a plurality of elemental components. The elemental components may be identical cells electrically connected in parallel with one another; in this case, the regions 13 and 14 are in the form of concentric circles or squares and each of the regions 15 is in the form of a circular or square frame. Alternatively, the elemental components may be elongate and may be disposed side by side to form a comblike or interdigitated structure. In this case, the buried base region is a single region common to all of the elemental components, the region 14 constitutes a "tooth" of a comb, and the insulation region 15 defines adjacent insulated regions 16 which also form "comb teeth".

FIG. 2 shows an electrical circuit equivalent to the structure described above. This is a device formed by a bipolar transistor T1 and by an N-channel MOSFET transistor T2, both with vertical conduction, in the emitter switching configuration. As can easily be seen, the emitter and base regions of the npn transistor T1 are constituted by the regions 14 and 13 of FIG. 1, respectively, and the collector region of the transistor T1 is constituted substantially by the regions of the epitaxial layer 11 and of the layer 10 which are disposed beneath the base region 13. The source region of the MOSFET transistor T2 is constituted by the N+ region 26 which is connected to the body region 25 on the surface by the metal strip 4 which constitutes the electrode S of the device. The drain region of T2 is constituted by the zone of the epitaxial layer 12 disposed beneath the body region 25 bordering the emitter region 14. The collector electrode of T1, the source electrode of T2, the base electrode of T1 and the gate electrode of T2 constitute the electrodes C, S, B and G of the device.

The resistance (RCSon) between the power terminals of the device during conduction is given by the sum of the resistance between the collector and the emitter of the bipolar power transistor T1 and the resistance between the drain and source of the MOSFET transistor T2. Naturally, if the device is constituted by a plurality of elemental functional components, the resistance between its power terminals is given by the resistances RCSon of its components in parallel. In some applications the contribution of the vertical MOSFET transistor to the resistance RCSon is considered excessive.

SUMMARY OF THE INVENTION

An embodiment of the present invention provides a device with integrated bipolar and MOSFET transistors in an emitter switching configuration which, when conductive, has a lower resistance than known devices.

An embodiment of the invention is directed to device with a bipolar transistor and a MOSFET transistor connected to one another and integrated in a chip of semiconductor material. The device includes a semiconductive layer of a first conductivity type, which comprises a first conduction region of the bipolar transistor; a first buried region of a second conductivity type, which is buried in the semiconductive layer and forms a base region of the bipolar transistor; a second buried region of the first conductivity type, which is buried in the semiconductive layer, is positioned on the base region, and comprises a second conduction region of the bipolar transistor. In contrast to the prior art, the device also includes a well region of the second conductivity type, which extends downward from a front surface of the chip; a first MOSFET conduction region of the first conductivity type extending downward into the well region from the front surface of the chip; a second MOSFET conduction region of the first conductivity type, which contacts and extends upward from the second conduction region of the bipolar transistor into a position between and spaced apart from the first and second portions of the first MOSFET conduction region, thereby defining a channel of the MOSFET transistor within the well region and between the first and second MOSFET conduction regions; and a strip of electrically conductive material disposed over the channel and insulated from the channel by a layer of insulating material, the strip functioning a gate electrode of the MOSFET transistor.

BRIEF DESCRIPTION OF THE DRAWINGS

The invention will be understood better from the following detailed description of an embodiment thereof given with reference to the appended drawings, in which.

DETAILED DESCRIPTION OF THE INVENTION

Figure 1:
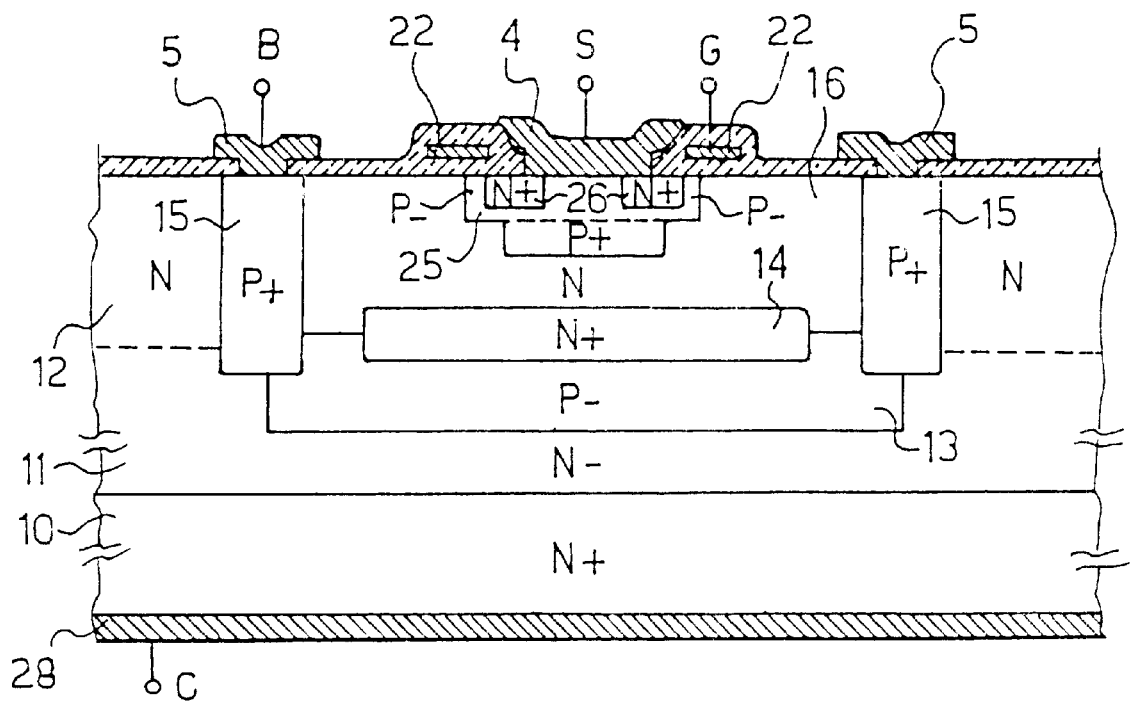
FIG. 1 shows the structure of a known device, in section.
Figure 2:
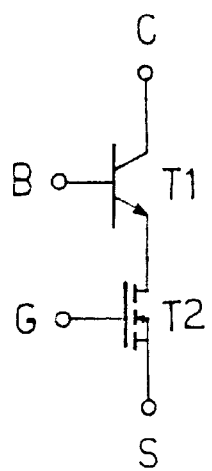
FIG. 2 shows an electrical circuit equivalent to the structure of FIG. 1.
Figure 3:
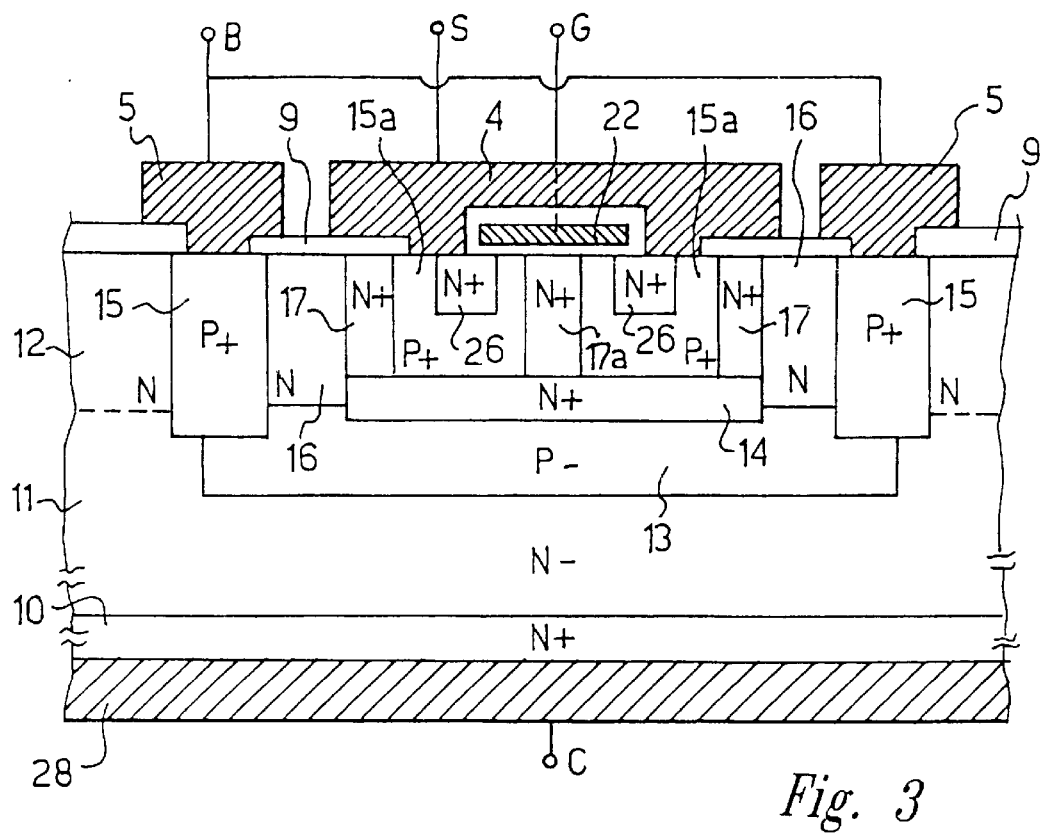
FIG. 3 shows the structure of a device according to the invention, in section.

A device according to the invention shown in FIG. 3, in which parts identical or corresponding to those of FIG. 1 are indicated by the same reference numerals or symbols, is formed on a chip of N-type semiconductor material, starting with a monocrystalline silicon substrate 10 strongly doped with N-type impurities. A layer with the same type of conductivity N but with a considerably lower concentration of impurities is formed on the substrate 10. More particularly, a first layer 11 with a lower concentration of impurities, indicated N− in the drawing, is formed first of all by epitaxial growth. P-type doping species are then implanted in the surface of the epitaxial layer 11 in a relatively low concentration, followed by N-type doping species in a relatively high concentration, substantially within the P-type implanted areas. A second N-type layer 12 having a concentration of impurities greater than that of the first layer 11 is formed on the layer 11 by epitaxial growth. During this stage, which takes place at high temperature, the P-type and N-type doping species implanted diffuse in the two epitaxial layers giving rise to the buried regions indicated 13 and 14, respectively, in the drawing. A pn junction is formed between these regions 13 and 14 which are intended to constitute the base and emitter regions of the bipolar transistor, respectively. P+ regions, indicated 15 and 15a are then formed in the second epitaxial layer 12 by known photolithography and diffusion techniques. The regions 15 extend all the way through the second epitaxial layer 12, are connected to the regions 13, and have the functions of deep base contacts of the bipolar transistor and of insulating the transistor from the rest of the structure.

In plan, in a device with a cell structure, the regions 13 and 14 are in the form of concentric circles or squares and each region 15 is in the form of a circular or square frame. Portions of the second epitaxial layer 12 are thus defined within the regions 15, and are closed at the bottom by the regions 13 and 14 so as to form N-type pockets, indicated 16, which are insulated from one another.

In a device with an interdigitated structure, the region 14 is in the form of a tooth of a comb and the insulation region 15 defines, relative to one another, insulated regions 16 also in the form of comb teeth.

The region 15a which has the function of the body region of the MOSFET transistor, also extends through the second epitaxial layer 12 but has a lateral dimension such that it does not extend beyond the edges of the buried N+ region 14. The regions 15 and 15a are advantageously formed simultaneously by the same photolithography and diffusion operations, the process parameters being selected in a manner such that the region 15a does not appreciably modify the resistivity of the buried N+ layer 14.

Additional N-type regions with a high concentration of impurities, indicated 17 and 17a, are then formed within the P region 15a and extend as far as the buried region 14. In a cell structure, the region 17 forms a circular or square frame in plan and has the function of extending the emitter region of the bipolar transistor to the front surface of the chip. The region 17a extends in the P region 15a in a substantially central position with the function which will be explained below.

After the formation of a thin layer of dielectric material on the surface of the chip, a polycrystalline silicon layer is then formed, from which the gate electrode, indicated 22, of the elemental MOSFET transistor is produced. In a cell structure or an interdigitated structure, the gate electrodes of the various elemental MOSFET transistors are connected to one another electrically and are connected to a common gate terminal which is also one of the terminals of the device, indicated G in the drawings.

An N+ region 26 is then formed, extending in the P body region 15a with one of its edges at a constant distance from the N+ region 17a and constituting the source region of the MOSFET transistor. The region 17a defines, with the region 26, the channel of the MOSFET transistor and constitutes the drain region thereof.

Electrical interconnection tracks are then formed on the front surface of the chip, which is covered by a silicon dioxide layer, indicated 9, by known deposition, masking and etching techniques. More particularly, metal strips, indicated 4 and 5, are formed. The strip 4 contacts surface regions of the P body region 15a and the source region 26 and constitutes the source electrode S of the MOSFET transistor. The strips 5 contact, on the surface, the insulation and deep base contact regions 15 and constitute the base terminal B of the bipolar transistor. Finally, a metal layer 28, which constitutes the collector terminal C of the device, is formed on the bottom of the substrate 10.

As can easily be seen, the MOSFET transistor of the device shown in FIG. 3 is a transistor with lateral conduction and its resistance between source and drain, when conductive, is due essentially to the resistivity and to the dimensions of the channel, whereas that of the known device of FIG. 1 is also due to the resistivity and to the thickness of the epitaxial layer 12 and, in a structure with several adjacent body regions 25 (not shown in FIG. 1), to the effect of restriction of the space between body regions due to the reverse polarization of the junction between the body regions and the drain region 16.

Another advantage of the device shown in FIG. 3 is that it can be produced without operations additional to the standard operations for the production of a normal bipolar power transistor, that is, a bipolar power transistor without MOSFET transistors in the emitter switching configuration. In fact, the P body region 15a of the MOSFET transistor can be formed by the same processing steps which are necessary for the deep base contact and insulation region 15 and the N drain region 17a can be formed by the same processing steps which are necessary to produce the regions 17 defining the emitter laterally. If the device is integrated in a chip together with a control circuit, the source region 26 can be formed by the same processing steps which are necessary to produce the collector regions of the npn bipolar transistors of the control circuit.

Moreover, in the preferred embodiment of the device according to the invention, shown in FIG. 3, the arrangement of the region 17a centrally on the buried N+ region 14 and the arrangement of the base contact region 15 at the edges of the buried P− region 13 have the effect of automatically balancing the voltage Vbe between the base and the emitter. In fact, it is pointed out that the base current causes a greater voltage drop in the buried P− region 13 the longer is the path of the current from the electrode 5 to the junction with the emitter region 14, and that the emitter current causes an effect with the opposite sign in the buried N+ region 14. Bearing in mind that the base current is also considerably smaller than the emitter current when the transistor is conductive and that the resistivity of the P− region 13 is greater than that of the N+ region 14, the two opposite effects tend to balance one another out so that the voltage Vbe remains substantially constant along the entire base-emitter junction.

Figure 4:
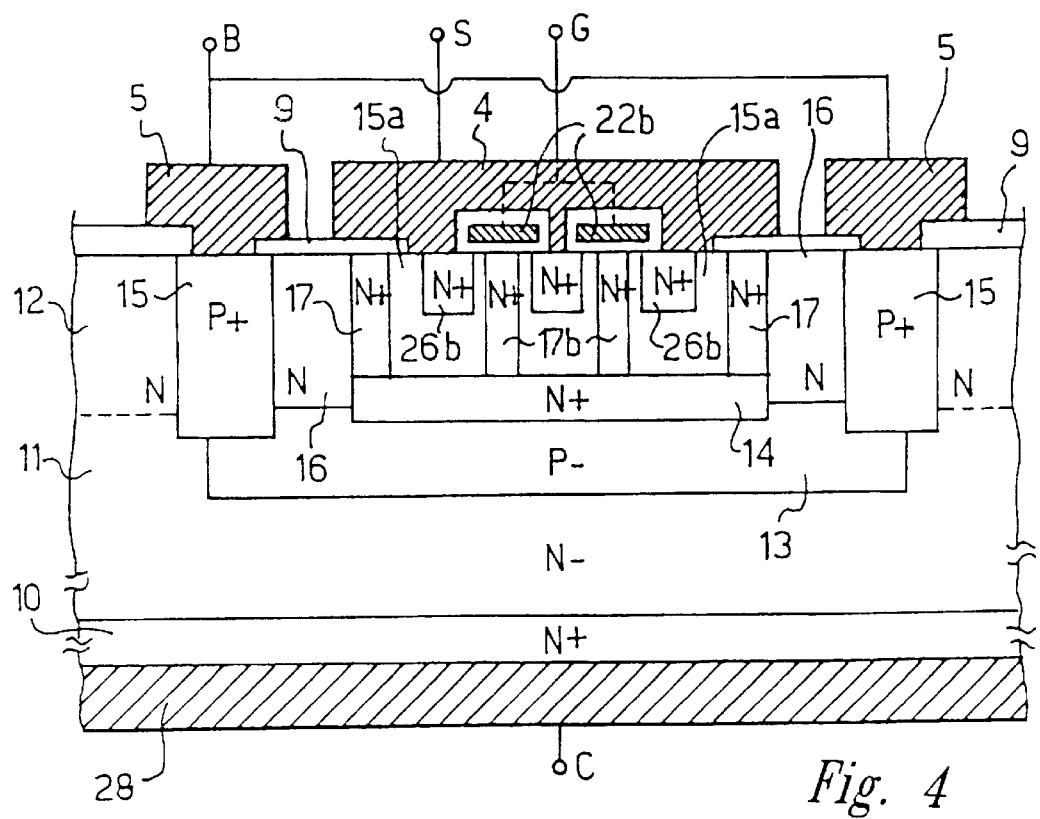
FIG. 4 shows a variant of the structure of FIG. 3, in section.

According to another embodiment of the invention, shown in FIG. 4, in which elements identical or corresponding to those of FIG. 3 are indicated by the same reference numerals or symbols, the drain region is subdivided into two sub-regions, indicated 17b, and the source region is divided into three sub-regions, indicated 26b. The gate electrode is also divided into two portions, indicated 22b. Thus, four lateral MOSFET transistors in parallel, with channel lengths less than or equal to those of the individual MOSFET transistor of the device shown in FIG. 3, are produced and an even lower overall resistance Ron of the transistor when it is conductive is achieved. Naturally, the drain regions and the source regions may be divided into more than two sub-regions, if necessary, so as to form more than four lateral MOSFET transistors in parallel.

Although only one embodiment of the invention has been described, with a single variant, it will be clear to one of ordinary skill in semiconductor technology that many variations and modifications are possible within the scope of the same inventive concept. For example, P-type layers and regions may be used instead of the N-type layers and regions and vice versa, thus producing a device complementary to that described.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A device with a bipolar transistor and a MOSFET transistor connected to one another in the "emitter switching" configuration and integrated in a chip of semiconductor material, comprising:

a substrate with a first type of conductivity and with a high concentration of impurities;

a layer with the first type of conductivity, superimposed on the substrate and having a concentration of impurities lower than that of the substrate, wherein the layer and the substrate comprises a collector region of the bipolar transistor;

a first electrically conductive surface contact element which extends on the surface of the substrate remote from the layer and has the function of a collector electrode of the bipolar transistor;

a region with a second type of conductivity and with a low concentration of impurities, buried in the layer with the first type of conductivity and forming a base region of the bipolar transistor;

a base contact and insulation region with the second type of conductivity and with a high concentration of impurities, which extends from a front surface of the chip, that is, from a surface of the chip opposite to the collector terminal, as far as an edge of the region with the second type of conductivity;

an insulated region with the first type of conductivity defined within the base contact and insulation region;

a second electrically conductive surface contact element on the base contact and insulation region, with the function of a base electrode of the bipolar transistor;

a region with the first type of conductivity and with a high concentration of impurities, which is buried in the insulated region, forms a pn junction with the base region, and comprises an emitter region of the bipolar transistor, a further region with the second type of conductivity which extends from the front surface of the chip in the insulated region and comprises a channel of the MOSFET transistor, wherein the further region with the second type of conductivity extends as far as the buried region with the first type of conductivity;

a further region with the first type of conductivity and with a high concentration of impurities, which extends from the front surface of the chip into the further region with the second type of conductivity, and which comprises a source region of the MOSFET transistor;

a third electrically conductive surface contact element on the further region with the first type of conductivity, with the function of a source electrode of the MOSFET transistor;

a strip of electrically conductive material disposed over the channel, insulated from the front surface of the chip by a layer of insulating material, and having the function of a gate electrode of the MOSFET transistor; and an additional region with the first type of conductivity and with a high concentration of impurities, which extends from the front surface of the chip into the further region with the second type of conductivity, as far as the buried region with the first type of conductivity, defining, with the further region with the first type of conductivity, the channel of the MOSFET transistor, and comprising a drain region of the MOSFET transistor.

2. A device according to claim 1, which comprises a further additional region with the first type of conductivity and with a high concentration of impurities, which extends from the front surface of the chip as far as the buried region with the first type of conductivity and surrounds the further region with the second type of conductivity.

3. A device according to claim 1, in which the additional region with the first type of conductivity is disposed in a central zone of the further region with the second type of conductivity.

4. A device according to claim 1, in which the additional region with the first type of conductivity is divided into first sub-regions, and the further region with the first type of conductivity is divided into second sub-regions, the first sub-regions alternating with the second sub-regions so as to form source and drain regions of MOSFET transistors disposed side by side.

5. A device according to claim 1, in which the bipolar transistor and the MOSFET transistor together constitute an elemental functional component of a plurality of elemental functional components of the device.

6. A device with a bipolar transistor and a MOSFET transistor connected to one another and integrated in a chip of semiconductor material, comprising:
   a semiconductive layer of a first conductivity type, which comprises a first conduction region of the bipolar transistor;
   a first buried region of a second conductivity type, which is buried in the semiconductive layer and comprises a base region of the bipolar transistor;
   a second buried region of the first conductivity type, which is buried in the semiconductive layer, is positioned on the base region, and comprises a second conduction region of the bipolar transistor;
   a first MOSFET conduction region of the first conductivity type and having first and second portions spaced apart from each other and extending downward from a front surface of the chip;
   a second MOSFET conduction region of the first conductivity type, which contacts and extends upward from the second conduction region of the bipolar transistor into a position between and spaced apart from the first and second portions of the first MOSFET conduction region, thereby defining a channel of the MOSFET transistor between the first and second MOSFET conduction regions; and
   a strip of electrically conductive material disposed over the channel and insulated from the channel by a layer of insulating material, the strip functioning as a gate electrode of the MOSFET transistor.

7. The device of claim 6, further comprising:
   a base contact region with the second conductivity, which extends from the front surface of the chip to the first buried region; and
   a conductive surface contact contacting the base contact region and functioning as a base electrode of the bipolar transistor.

8. The device of claim 6 wherein the semiconductive layer includes a semiconductive substrate having a high level of impurities, a first layer superimposed on the substrate and having a concentration of impurities lower than that of the substrate, and a second layer superimposed on the first layer and having a concentration of impurities intermediate of those of the substrate and first layer.

9. The device of claim 6, further comprising:
   a well region of the second conductivity type, which extends downward from the front surface of the chip, completely surrounds the first and second MOSFET conduction regions, and extends between the first and second MOSFET conduction regions to form the channel.

10. The device of claim 9, further comprising:
    a sinker region of the first conductivity type and with a high concentration of impurities compared to the semiconductive layer into which the sinker region extends from the front surface of the chip to the second buried region, the sinker region completely surrounding the well region.

11. The device of claim 6, further comprising an electrically conductive surface contact element contacting the semiconductive layer and positioned on a back surface of the chip, the surface contact element functioning as a collector electrode of the bipolar transistor.

12. The device of claim 6 wherein the first MOSFET conduction region is divided into first sub-regions and the second MOSFET conduction region is divided into second sub-regions, the first sub-regions alternating with the second sub-regions so as to form source and drain regions of MOSFET transistors disposed side by side.

13. The device of claim 6 wherein the first MOSFET conduction region is a frame that completely surrounds the second MOSFET conduction region.

14. A device with a bipolar transistor and a MOSFET transistor connected to one another and integrated in a chip of semiconductor material, comprising:
    a semiconductive layer of a first conductivity type, which comprises a first conduction region of the bipolar transistor;
    a first buried region of a second conductivity type, which is buried in the semiconductive layer and comprises a base region of the bipolar transistor;
    a second buried region of the first conductivity type, which is buried in the semiconductive layer, is positioned on the base region, and comprises a second conduction region of the bipolar transistor;
    a well region of the second conductivity type, which extends downward from a front surface of the chip;
    a first MOSFET conduction region of the first conductivity type extending downward into the well region from the front surface of the chip;
    a second MOSFET conduction region of the first conductivity type, which contacts and extends upward from the second conduction region of the bipolar transistor into a position between and spaced apart from the first and second portions of the first MOSFET conduction region, thereby defining a channel of the MOSFET transistor within the well region and between the first and second MOSFET conduction regions; and
    a strip of electrically conductive material disposed over the channel and insulated from the channel by a layer of insulating material, the strip functioning a gate electrode of the MOSFET transistor.

15. The device of claim 14, further comprising:
    a base contact region with the second conductivity, which extends from the front surface of the chip to the first buried region; and
    a conductive surface contact contacting the base contact region and functioning as a base electrode of the bipolar transistor.

16. The device of claim 14 wherein the semiconductive layer includes a semiconductive substrate having a high level of impurities, a first layer superimposed on the substrate and having a concentration of impurities lower than that of the substrate, and a second layer superimposed on the first layer and having a concentration of impurities intermediate of those of the substrate and first layer.

17. The device of claim 14, further comprising:
    a sinker region of the first conductivity type and with a high concentration of impurities compared to the semiconductive layer into which the sinker region extends from the front surface of the chip to the second buried region, the sinker region completely surrounding the well region.

18. The device of claim 14, further comprising an electrically conductive surface contact element contacting the semiconductive layer and positioned on a back surface of the chip, the surface contact element functioning as a collector electrode of the bipolar transistor.

19. The device of claim 14 wherein the first MOSFET conduction region is divided into first sub-regions and the second MOSFET conduction region is divided into second sub-regions, the first sub-regions alternating with the second sub-regions so as to form source and drain regions of MOSFET transistors disposed side by side.

20. The device of claim 14 wherein the first MOSFET conduction region is a frame that completely surrounds the second MOSFET conduction region.

* * * * *